United States Patent [19]

Nibby, Jr. et al.

[11] 4,077,565

[45] Mar. 7, 1978

[54] ERROR DETECTION AND CORRECTION LOCATOR CIRCUITS

[75] Inventors: Chester M. Nibby, Jr., Peabody; George J. Barlow, Tewksbury, both of Mass.

[73] Assignee: Honeywell Information Systems Inc., Waltham, Mass.

[21] Appl. No.: 727,820

[22] Filed: Sep. 29, 1976

[51] Int. Cl.² .................... G11C 29/00; G06F 11/12
[52] U.S. Cl. .................................................. 235/312
[58] Field of Search .................. 235/153 AM, 312; 340/146.1 AL

[56] References Cited

U.S. PATENT DOCUMENTS

| | | | |
|---|---|---|---|
| 3,766,521 | 10/1973 | Carter et al. | 235/152 AM |
| 3,814,921 | 6/1974 | Nibby et al. | 235/153 AM |
| 3,836,957 | 9/1974 | Duke et al. | 340/146.1 AL |
| 3,949,208 | 4/1976 | Carter | 235/153 AM |
| 4,005,405 | 1/1977 | West | 340/146.1 AL |

*Primary Examiner*—Charles E. Atkinson
*Attorney, Agent, or Firm*—Faith F. Driscoll; Nicholas Prasinos; Ronald T. Reiling

[57] ABSTRACT

A main memory system includes encoder and decoder circuits. The encoder circuits are connected to receive data bits and parity bits and from them generate check code bits which are stored with the data bits during a write cycle of operation. The decoder circuits are connected to receive data and check bits read out from memory during a read cycle of operation. The decoder circuits include a plurality of decoder circuits and error locator circuits. Circuits via exclusive OR circuits generate a number of syndrome bit signals. These signals are divided into first and second groups. The first group is coded to specify which one of a number of decoder circuits comprising the error locator circuits is to be enabled in the case of an error condition. The second group of signals is coded to designate the particular data bit to be corrected by the decoder circuits. Predetermined output terminals of each of the decoder circuits representative of valid single bit data error conditions are applied to a plurality of correction circuits for modification of the data signals as specified by the decoder circuits. Additionally, signals from predetermined output terminals of certain ones of the decoder circuits representative of certain single check code bit error conditions are utilized for providing the correct parity for the data signals associated therewith.

21 Claims, 7 Drawing Figures

Fig. 3a.

| *PDE | 0 | 1 | 2 | 3 | 4 | 5 | 6 | 7 | A | 8 | 9 | 10 | 11 | 12 | 13 | 14 | 15 | B | BPS=(WBP₀ ⊕ WBP₁) |
|---|---|---|---|---|---|---|---|---|---|---|---|---|---|---|---|---|---|---|---|
| C0 |  |  |  |  |  |  |  |  |  |  |  | 1 | 1 | 1 | 1 | 1 | 1 | 1 |  |
| C1 |  | 1 | 1 | 1 | 1 | 1 | 1 | 1 |  |  |  |  |  |  |  |  |  | 1 |  |
| C2 |  |  |  | 1 | 1 | 1 | 1 |  |  |  |  |  |  | 1 | 1 | 1 | 1 |  |  |
| C3 |  | 1 | 1 |  | 1 |  |  | 1 | 1 | 1 |  | 1 | 1 |  | 1 |  | 1 |  |  |
| C4 | 1 | 1 |  | 1 |  |  | 1 |  | 1 | 1 |  | 1 |  | 1 |  | 1 |  |  |  |
| C5 | 1 |  | 1 | 1 |  |  | 1 | 1 |  | 1 |  | 1 | 1 |  |  | 1 | 1 |  |  |

BPS= BUS PARITY SUM

Fig. 3b.

| *PDE | 0 | 1 | 2 | 3 | 4 | 5 | 6 | 7 | A | 8 | 9 | 10 | 11 | 12 | 13 | 14 | 15 | B | **BPE | C0 | C1 | C2 | C3 | C4 | C5 |
|---|---|---|---|---|---|---|---|---|---|---|---|---|---|---|---|---|---|---|---|---|---|---|---|---|---|
| S0 |  | 1 | 1 | 1 | 1 | 1 | 1 | 1 | 1 | 1 | 1 |  |  |  |  |  |  |  |  | 1 | 1 |  |  |  |  |
| S1 |  |  |  |  |  |  |  |  | 1 | 1 | 1 | 1 | 1 | 1 | 1 | 1 | 1 | 1 |  |  | 1 |  |  |  |  |
| S2 |  |  | 1 | 1 | 1 | 1 |  |  |  |  |  | 1 | 1 | 1 | 1 |  |  |  |  |  |  | 1 |  |  |  |
| S3 | 1 | 1 |  | 1 |  |  | 1 | 1 | 1 |  |  | 1 | 1 |  | 1 |  |  |  |  |  |  |  | 1 |  |  |
| S4 | 1 | 1 |  | 1 |  |  | 1 |  | 1 | 1 |  | 1 |  | 1 |  | 1 |  |  |  |  |  |  |  | 1 |  |
| S5 | 1 |  | 1 | 1 |  |  | 1 | 1 |  | 1 |  | 1 | 1 |  |  | 1 | 1 |  |  |  |  |  |  |  | 1 |

**BPE= BUS PARITY ERROR
*PDE= PARTIAL WRITE DOUBLE ERROR

Fig. 3c.

|  | 0 | 1 | 2 | 3 | 4 | 5 | 6 | 7 | A | 8 | 9 | 10 | 11 | 12 | 13 | 14 | 15 | B | C0 | C1 | C2 | C3 | C4 | C5 |
|---|---|---|---|---|---|---|---|---|---|---|---|---|---|---|---|---|---|---|---|---|---|---|---|---|
| S0 | 1 | 1 | 1 | 1 | 1 | 1 | 1 | 1 | 1 | 1 |  |  |  |  | 1 |  |  |  |  |  |  |  |  |  |
| S1 |  |  |  |  |  |  |  | 1 | 1 | 1 | 1 | 1 | 1 | 1 | 1 | 1 | 1 |  |  | 1 |  |  |  |  |
| S2 |  |  | 1 | 1 | 1 | 1 |  |  |  |  |  | 1 | 1 | 1 | 1 |  |  |  |  |  | 1 |  |  |  |
| S3 | 1 | 1 |  | 1 |  |  | 1 | 1 | 1 |  |  | 1 | 1 |  | 1 |  |  |  |  |  |  | 1 |  |  |
| S4 | 1 | 1 |  | 1 |  |  | 1 |  | 1 | 1 |  | 1 |  | 1 |  | 1 |  |  |  |  |  |  | 1 |  |
| S5 | 1 |  | 1 | 1 |  |  | 1 | 1 |  | 1 |  | 1 | 1 |  |  | 1 | 1 |  |  |  |  |  |  | 1 |

ERROR DETECTION AND CORRECTION LOCATOR CIRCUITS

RELATED PATENT APPLICATION

1. "Apparatus and Method for Storing Parity Encoded Data from a Plurality of Input/Output Sources" invented by George J. Barlow and Chester M. Nibby, Jr., Ser. No. 727,821, filed on Sept. 29, 1976 and assigned to the same assignee as named herein.

BACKGROUND OF THE INVENTION

1. Field of Use

This invention relates generally to data processing systems and more particularly to error correction apparatus included within the memory of a data processing system.

2. Prior Art

As discussed in greater detail in the referenced related patent application, in order to increase memory reliability notwithstanding attendant increases in error detection and correction circuits, at least one system utilizes codes which improve upon the modified Hamming SEC/DED codes and simplify the memory circuit implementation as well as provide faster and better error detection capability. This arrangement is described in a paper "A Class of Optimal Minimum Odd-Weight-Column SEC/DED Codes" by M. Y. Hsiao which appears in the publication "IBM Journal of Research and Development", July, 1970.

The paper describes the construction of such codes in terms of a parity check matrix H. The selection of the columns of the H matrix for a given $(n, k)$ code is based upon the following constraints:

1. Every column should have an odd number of one's;
2. The total number of one's in the H matrix should be a minimum; and,
3. The number of one's in each row of the H matrix should be made equal or as close as possible to the average number.

Errors are indicated by analyzing the syndromes formed from the data and check code bits. An odd number of syndrome bits indicates a single error while an even number of syndrome bits indicates a double or uncorrectable error.

In the above mentioned arrangement as well as other prior art systems, while reducing the amount of circuits by observing the constraints mentioned above, such systems still require large numbers of multi-input AND error locator circuits as well as circuits for generating parity bit signals for the data read out of memory. Thus, the disadvantages of such arrangements are their higher cost, complexity in implementation and lower reliability. That is, if the implementation requires fewer circuits and connections, its chance of failure is decreased. Also, such systems may require construction of special circuits which would also result in higher cost.

Accordingly, it is a primary object of the present invention to provide apparatus for locating errors which has a high reliability and employs standard circuits.

It is another object of the present invention to provide apparatus for locating errors and for concurrently providing correct parity for the data when read out.

It is a more specific object of the present invention to provide apparatus which both locates errors and provides correct parity for the read out data in a manner which requires a minimum of additional circuits.

SUMMARY OF THE INVENTION

The above and other objects are achieved in a preferred embodiment of the present invention which includes error locator circuits. These circuits connect to receive syndrome signals which indicate the presence of single bit and multiple bit errors formed by decoder circuits which connect to the output circuits of a memory system. The error locator circuits comprise a small number of decoder circuits which connect to a plurality of correction circuits and parity circuits. In response to the syndrome signals, the decoder circuits generate signals for locating any data bit signal in error and concurrently provide for correct parity for the read out data.

In accordance with the teachings of the present invention, a minimum number of standard decoder circuits are utilized to locate single bit errors within a parity check matrix constructed in accordance with the constraints discussed above. In a preferred embodiment, a 3 to 8 decoder circuit is employed. This circuit may take the form of the circuits discussed at pages 274–275 of the text "TTL Data Book for Design Engineers — First Edition" dated 1973.

In accordance with the preferred embodiment, the syndrome signals are divided into first and second groups. The first group is coded to specify which one of the decoder circuits is to be enabled in response to a single bit or double bit error condition. The second group of signals is coded to designate one of a plurality of outputs indicative of which one of a smaller number of data bits is to be corrected. The first and second groups are applied to a set of three enable inputs and three binary select inputs respectively of each decoder circuit.

A predetermined number of output terminals of each decoder circuit representative of valid single bit errors to be corrected are applied as inputs to a number of data correction circuits and to circuits for providing correct parity signals for the data signals associated therewith. Since the remaining output terminals of the decoder circuits designate noncorrectable conditions (e.g. multiple error conditions), they are not used.

It will be appreciated that the error locator circuits of the present invention finds specific use in the aforementioned referenced related copending patent application. The circuits of the present invention reduce the overall complexity of the memory system disclosed in the referenced copending patent application. This results in decreased cost and increased reliability.

The novel features which are believed to be characteristic of the invention both as to its organization and method of operation, together with further objects and advantages will be better understood from the following description when considered in connection with the accompanying drawings. It is to be expressly understood, however, that each of the drawings is given for the purpose of illustration and description only and is not intended as a definition of the limits of the present invention.

BRIEF DESCRIPTION OF THE DRAWINGS

FIGS. 3a through 3c illustrate matrices utilized in connection with the apparatus of the present invention.

DESCRIPTION OF THE PREFERRED EMBODIMENT

Figure 1:
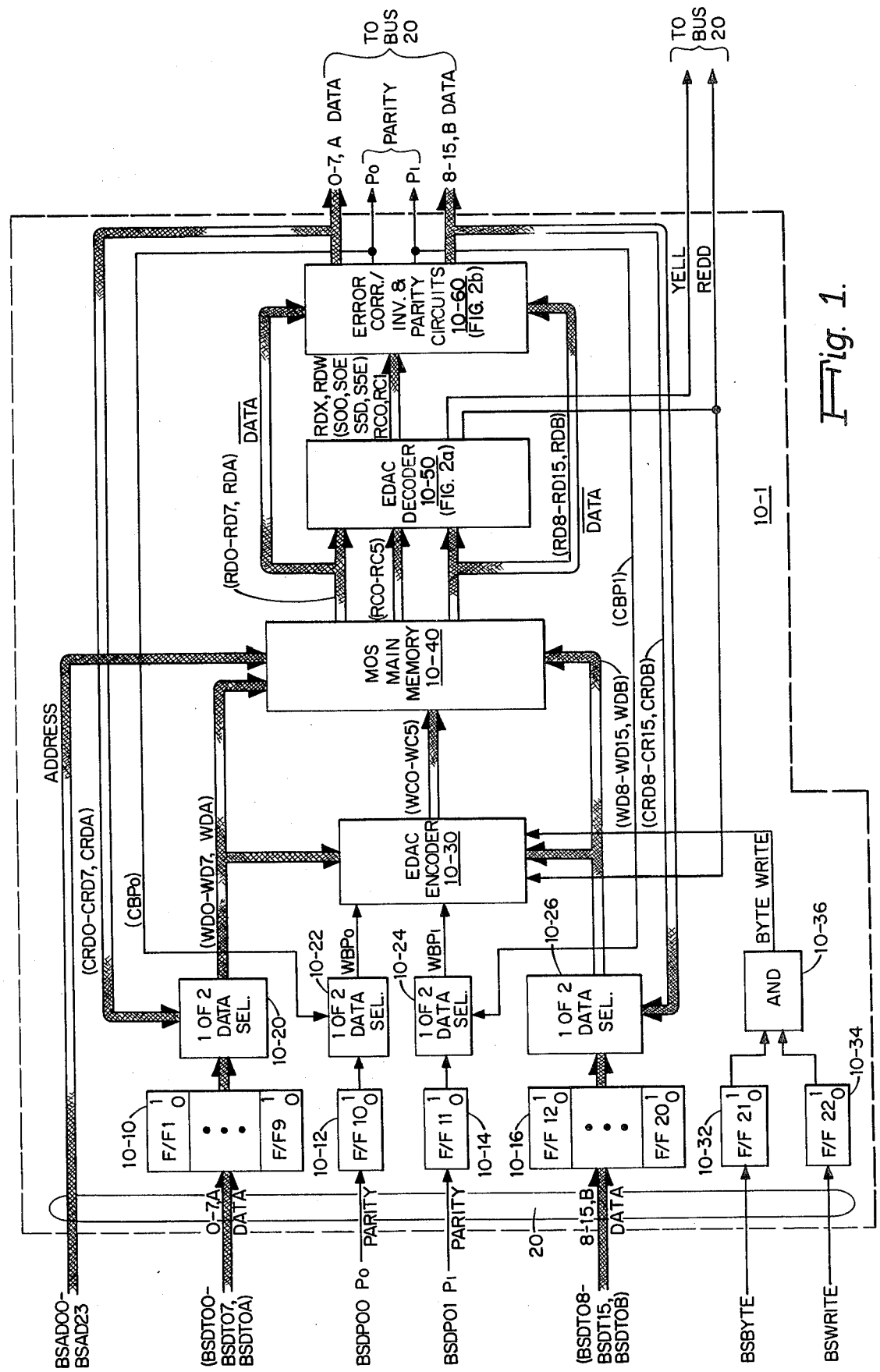
FIG. 1 illustrates in block diagram form a memory subsystem which incorporates the apparatus of the present invention.

It is seen that the memory subsystem in accordance with the present invention includes a MOS memory 10-40 which for the purposes of the present invention can be considered conventional in design. For example, the memory 10-40 can be constructed with the memory circuits disclosed in U.S. Pat. No. 3,786,437 invented by Brian F. Croxon, et al which issued Jan. 15, 1974.

The memory subsystem 10-1 further includes a plurality of input flip-flops 10—10 through 10-34, a plurality of selector circuits 10-20 through 10-26, an EDAC encoder circuit 10-30, an EDAC decoder circuit 10-50 and error correction, inverter and parity circuits. The plurality of input flip-flops of blocks 10—10 through 10-34 are connected to receive corresponding ones of the signals from bus 20. That is, flip-flops 1 through 9 of block 10—10 receive signals BSDT00-BSDT07, BSDTOA of a first or left hand byte which correspond to data bits 0-7 and A of the bus 20. Flip-flop 10 of block 10-12 receives a parity signal BSDP00 which contains odd parity for bits 0-7 and A. Flip-flop 11 of block 10-14 receives a parity signal BSDP01 which contains odd parity for data bits 8-15, B of a second or right hand byte.

The flip-flops 12-20 of block 10-16 receive the data bits 8-15, B of the second byte from bus 20. Further, flip-flops 21 and 22 receive byte and write control signals BSBYTE and BSWRIT during a write operation. The byte signal BSBYTE indicates whether the transfer is a byte or word transfer. When a binary ONE, it indicates that the current transfer is a byte transfer. The signal BSWRIT indicates the direction of transfer. When a binary ONE, it indicates that the transfer is from the master unit to the slave unit. The binary ONE outputs of flip-flops 21 and 22 representative of stored states of the byte and write control signals are combined in an AND gate 10-36 to produce a BYTE WRITE signal. When the BYTE WRITE signal is forced to a binary ONE, this signals the memory subsystem that it is to perform a partial write operation.

The signals BSAD00 through BSAD23 are memory address signals which are applied to the input address circuits (not shown) of memory 10-40. Each 24 bit address includes 8 memory module select bits, 15 internal address bits and a byte designator bit and designates a word storage location in memory 10-40.

As seen from FIG. 1, it is seen that the output signals of flip-flops 1-20 are applied as one input of corresponding ones of the plurality of one of two data selector circuits 10-20, 10-22, 10-24 and 10-26. The second input to each of the data selector circuits is from the output of the error correction, inverter and parity circuits of block 10-60. The signals CRD0-CRD7, CRDA, CRD8-CRD15, CRDB, CRP0 and CRP1 are selected from the second input for application to memory 10-40 and EDAC encoder circuit 10-30 during the read portion of a partial write cycle of operation.

The output signals WD0-WD7, WDA selected from either flip-flops 1-9 or inverter circuits of block 1-60 by data selector circuit 10-20 are applied to the EDAC encoder circuit 10-30 and to the write circuits (not shown) of memory 10-40 as shown. The parity signals WBP0 and WBP1, selected from either flip-flops 10 and 11 or the circuits of block 10-60, are applied as inputs to EDAC encoder 10-30. Further, the byte signals WD9-WD15, WDB from either flip-flops 12-20 or circuits 10-60 are applied as inputs to EDAC encoder 10-30 and memory 10-40.

The EDAC encoder 10-30 generates from the byte data signals WD0-WD15, WDA, WDB and parity signals WBP0, WBP1, check code bit signals WC0-WC5. The check code signals together with the byte data signals associated therewith are stored in memory 10-40. It will be appreciated that the data and check bit signals RD0-RD15, RDA, RDB, RC0-RC5, when read out from MOS memory 10-40 into a data out register (not shown), are inverted or complemented. As seen from FIG. 2, the inverted bit signals are applied to EDAC decoder 10-50 and the circuits 10-60.

The EDAC decoder 10-50 produces six pairs of complementary syndrome bit signals S00, S0E through S50, S5E in addition to two error indicator signals YELL and REDD. The signal YELO when a binary ONE indicates the detection of a single error and that correction of the error was made. The signal REDD indicates the detection of a double bit error, a bus parity error or a byte write error as explained herein.

The EDAC decoder circuit 10-50 applies the pairs of syndrome signals and a pair of data bit signals RC0, RC1, RDX and RDY to the circuits 10-60. As explained herein, the circuits 10-60 provide corrected signals CRD0-CRD7, CRDA, CRD8-CRD15, CRDB to bus 20 and to data selector circuits 10-20 and 10-26 as mentioned previously. Also, the circuits 10-60 produce the parity signals CBP0 and CBP1 which are also applied to bus 20 and data selector circuits 10-20 and 10-26.

The combinations of signals to be summed are selected in accordance with the matrix of FIG. 3a. The matrix illustrates the generation of each of the check code bit signals WC0 through WC5. It will be noted that the matrix includes columns representing states of the data bits 0-7, A and 8-15, B. Data bits A and B are additional bit positions to be used for expansion. A column labeled PDE is used to represent the occurrence of a partial write double error condition which is signaled by the state of signal REDD as explained herein. The column labeled BPS represents the sum of the bus parity bit signals WBP0 and WBP1.

In each instance, a check code bit is generated by the exclusive OR of all of the columns which contain binary ONES (even and odd). For example, check code bit WC0 = 10 $\oplus$ 11 $\oplus$ 12 $\oplus$ 13 $\oplus$ 14 $\oplus$ 15 $\oplus$ B $\oplus$ BPS where BPS = WBP0 $\oplus$ WBP1.

The matrix of FIG. 3a is a simplified version of the matrix of FIG. 3b. The matrix of FIG. 3b represents a modified version of the so-called H matrix for generating the check code bits for the two byte, 18 bit, data word in accordance with the present invention. The basic matrix is expanded to include a PDE column for designating a partial write double error condition and a BPE column for designating a bus parity error.

It will be noted that the occurrence of either a bus parity error or a partial write double error results in causing the decoder circuit 10-50 to generate syndrome bits having an even number of binary ONES as explained herein. This results from including an even number of binary ONES in the PDE and BPS columns which relate to an even number of check code bits.

The matrix of FIG. 3b has been simplified so as to reduce the number of circuits required for generating the check code bits. That is, rows C0 and C1 in the basic H matrix have been modified so that they require fewer number of binary ONES.

It is seen that in FIG. 3b, C0 = 0 ⊕ 1 ⊕ 2 ... ⊕ 7 ⊕ 8 ⊕ 9 ⊕ A ⊕ BPE. Substituting into the previous expression, the appropriate value for BPE (i.e., 0 ⊕ 1 ⊕ ... 15 ⊕ P1) then C0 = 10 ⊕ 11 ⊕ ... ⊕ 15 ⊕ B ⊕ P0 ⊕ P1. By having BPS = P0 ⊕ P1; C0 = 10 ⊕ 11 ⊕ ... 15 ⊕ B ⊕ BPS. Similarly, it can be shown that C1 = 0 ⊕ 1 ⊕ 2 ... ⊕ 6 ⊕ BPS. For further information regarding encoder circuit 10-30, reference should be made to the referenced copending patent application.

Figure 2A:
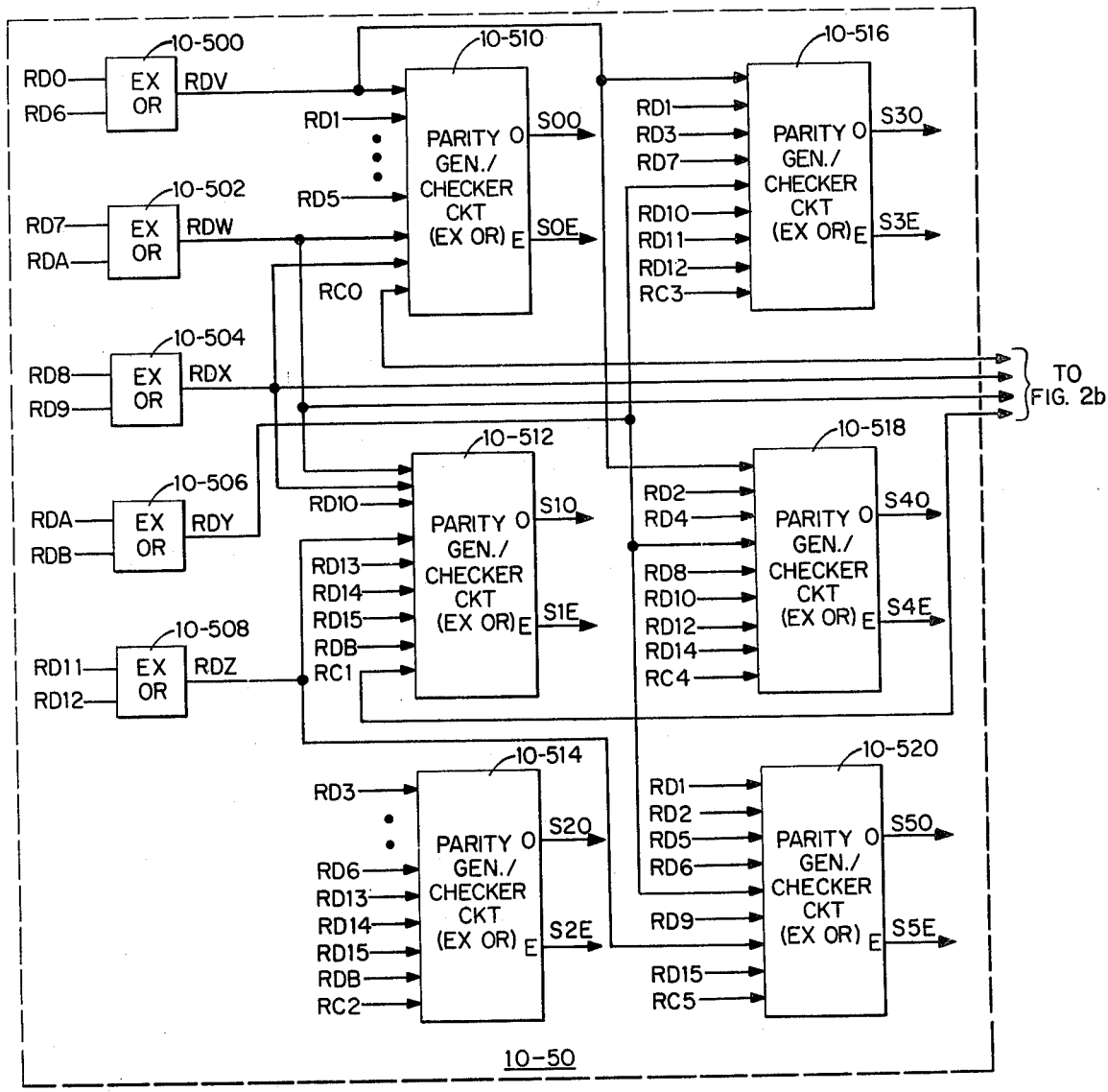
FIGS. 2a through 2b illustrate in greater detail, the apparatus of FIG. 1 in accordance with the present invention.

The decoder circuit 10-50 is shown in detail in FIG. 2a. The circuit 10-50 is constructed in accordance with the parity check matrix of FIG. 3c. It should be noted that this matrix does not include PDE or PBE columns. The reason is that the errors designated by these columns have been incorporated into the generation of check code bits by encoder circuit 10-30 and produce syndrome bits which include an even number of binary ONES upon the occurrence of such errors as mentioned previously.

Referring to FIG. 2a, it is seen that the decoder circuit 10-50 includes a plurality of exclusive OR circuits 10-500 through 10-520 arranged as shown. Similar to encoder circuit 10-30, the summing of the different binary ONE columns (odd and even) of the matrix of FIG. 3c required for the generation of syndrome bits S0 through S5 is also accomplished by means of parity generator/checker circuits. As indicated by FIG. 3c, S0 and S1 require summation of 12 column signals, and S3, S4 and S5 require summation of 11 column signals. Certain data bits (i.e., RD0, RD6 through RD11, RD12) are summed by exclusive OR circuits 10-500 through 10-508.

Since syndrome bits S0 and S1 are produced from an even number of column signals and syndrome bits S2-S5 are produced from an odd number of column signals, both the even and odd output terminals of circuits 10-510 through 10-520 are utilized as explained herein.

As mentioned previously, the signals read out of memory 10-40 are complemented. Accordingly, the input signals to each of the exclusive OR circuits are normally in a binary ONE state (i.e., positive voltage level). This means that the output signals RDV, RDW, RDY and RDZ are also in a binary ZERO state. Also, the even output terminals, designated E, of each of the circuits 10-510 and 10-512 are normally binary ONES while the same terminals of each of the circuits 10-514, 10-516, 10-518 and 10-520 are normally binary ZEROS. The odd output terminals, designated 0, of each of the circuits 10-510 through 10-520 are in a state which is complementary to the even output terminal associated therewith.

Figure 2B:
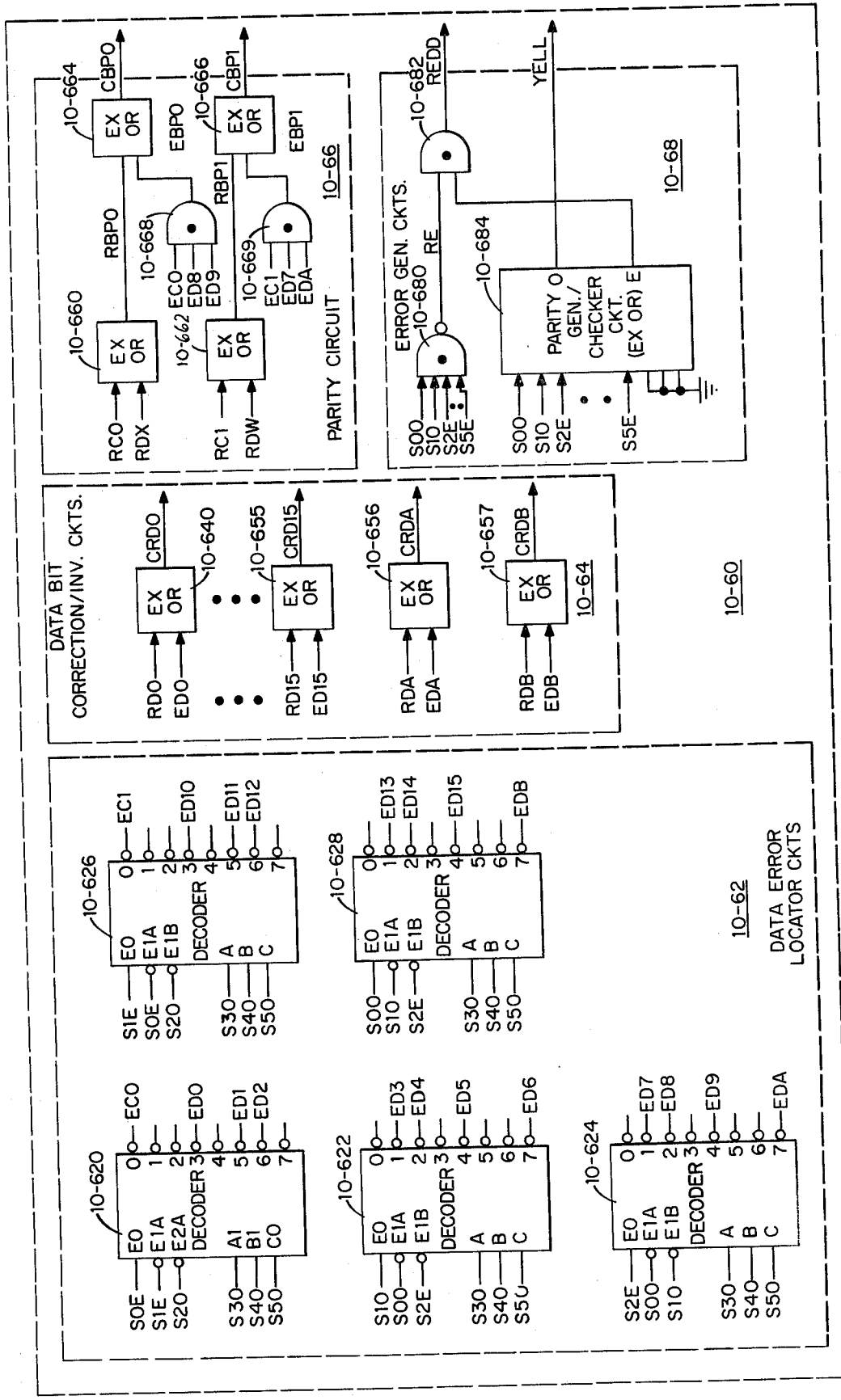

FIG. 2b illustrates the circuits of block 10-60 of the present invention which locate and correct single bit errors in addition to producing byte parity signals. As seen from the Figure, the block 10-60 includes a plurality of error location circuits 10-62, a plurality of correction circuits 10-64, a parity circuit 10-66 and a plurality of error generation circuits 10-68 arranged as shown.

The circuits 10-62 designate the particular bit which requires correction in the case of a single bit error. The circuits 10-62 include a plurality of decoder circuits 10-620 through 10-628 each of which receive different combinations of syndrome bit signals. The decoder circuits as mentioned previously employ standard circuits such as an SN74S138 manufactured by Texas Instruments Inc.

As seen from FIG. 2b, each decoder circuit has three enable input terminals and three binary select input terminals. The syndrome signals applied to the enable input terminals in the case of an error select one of the five decoder circuits while the syndrome signals applied to the select input terminals select the particular bit to be corrected. For example, where syndrome bits S0-S5 have a value 011010, results in the selection of decoder circuit 10-628 and in the forcing of signal ED14 from a binary ONE to a binary ZERO (i.e., from a positive voltage level to a zero voltage level).

A different one of the output signals EC0 through EDB from the circuits 10-62 is applied as one input of a particular one of the plurality of exclusive OR circuits 10-640 through 10-657 of the data bit correction circuits 10-64. Each exclusive OR circuit both corrects and inverts the state of the data bit signal applied as a second input thereto. More specifically, normally the signals applied to each exclusive OR circuit is a binary ONE placing the output terminal of each circuit at a binary ZERO. When no correction is designated, the decoder signal (e.g., signal ED4) remains a binary ONE. Therefore, the signal present at the output terminal of the exclusive OR circuit is the complement or inverse of the input data signal (e.g., signal CRD4 = $\overline{RD4}$). When correction is required, the decoder signal is forced to a binary ZERO state. Therefore, the signal present at the output terminal of the exclusive OR circuit is the same as the input data signal (e.g., signal CRD4 = RD4).

As seen from FIG. 2c, the parity circuit 10-66 includes exclusive OR circuits 10-660 through 10-666 and a pair of AND gates 10-668 and 10-669 arranged as shown. Parity bit CBP0 represents odd parity for bits 0-7 and A while parity bit CBP1 represents odd parity for bits 8-15 and B.

The above can be seen from FIGS. 3a and 3b. C0 (encoder) = 10 ⊕ 11 ⊕ 12 ⊕ 13 ⊕ 14 ⊕ 15 ⊕ B ⊕ BPS where BPS = 0 ⊕ 1 ⊕ 2 ... ⊕ 7 ⊕ A ⊕ 8 ⊕ 9 ... ⊕ 15 ⊕ B. Substituting the value for BPS into the expression for C0 results in the following C0 = 0 ⊕ 1 ⊕ 2 ⊕ A ⊕ 8 ⊕ 9. By applying signal RDX to exclusive OR circuit 10-660, this effectively cancels out bits 8 and 9 (i.e., RDX - RD8 + RD9). Thus, signal CBP0 = 0 + 1 ⊕ 2 ... ⊕ 7 ⊕ A and represents odd parity for bits 0-7 and A. The same is true for C1.

In FIG. 2c, normally RC0 is a binary ONE and signal RBP0 is also a binary ONE. When data bit signals RD8 and RD9 are equal, RDX is a binary ZERO. Signal RDP0 assumes the same state as signal RC0. When signals RD8 and RD9 are unequal, RDX is a binary ONE. Signal RBP0 is the complement of the state of signal RC0.

In the case of no correction, signal EBP0 is normally a binary ONE which means that signals EC0, ED8 and ED9 are normally binary ONES. Therefore, signal CBP0 corresponds to the complement of signal RBP0. In the case of a correction when signal EBP0 is forced to a binary ZERO, signal CBP0 assumes the same state as signal RBP0. The circuits 10-662 through 10-666 operate in a similar fashion to produce signal CBP1.

The last group of circuits in FIG. 2b generates error signals REDD and YELL. The circuits include a NAND gate 10-680, and AND gate 10-682 and an exclusive OR circuit 10-684 arranged as shown. The signal YELL signals the system of FIG. 1 shown the memory subsystem 10-1 detected a single bit error in a data word which it corrected. The signal REDD signals the system when the memory subsystem 10-1 detected an uncorrectable error which includes a double bit error, a bus parity error or a partial write error.

When there is no error, syndrome signals S00 through S5E are normally all binary ONES. This causes signal RE to be a binary ZERO which causes signal REDD to be a binary ZERO. The circuit 10-684 in this case forces its odd output terminal to a binary ZERO and its even output terminal to a binary ONE.

In the case of a correctable error where there is an odd number of syndrome bits, circuit 10-684 forces its odd terminal to a binary ONE and its even terminal to a binary ZERO. Hence, signal REDD remains a binary ZERO. Thus, the state of signal RE does not matter in this case.

When there is uncorrectable error where there is an even number of syndrome bits, two or more of the syndrome signals S00-S5E are binary ZEROS. This forces signal RE to a binary ONE. The circuit 10-684 forces its even output terminal to a binary ONE and its odd output terminal to a binary ZERO. This causes AND gate 10-682 to force signal REDD to a binary ONE.

DESCRIPTION OF THE OPERATION

With reference to FIGS. 1-4, the operation of the apparatus of the preferred embodiment will now be described with respect to an example.

Figure 4:
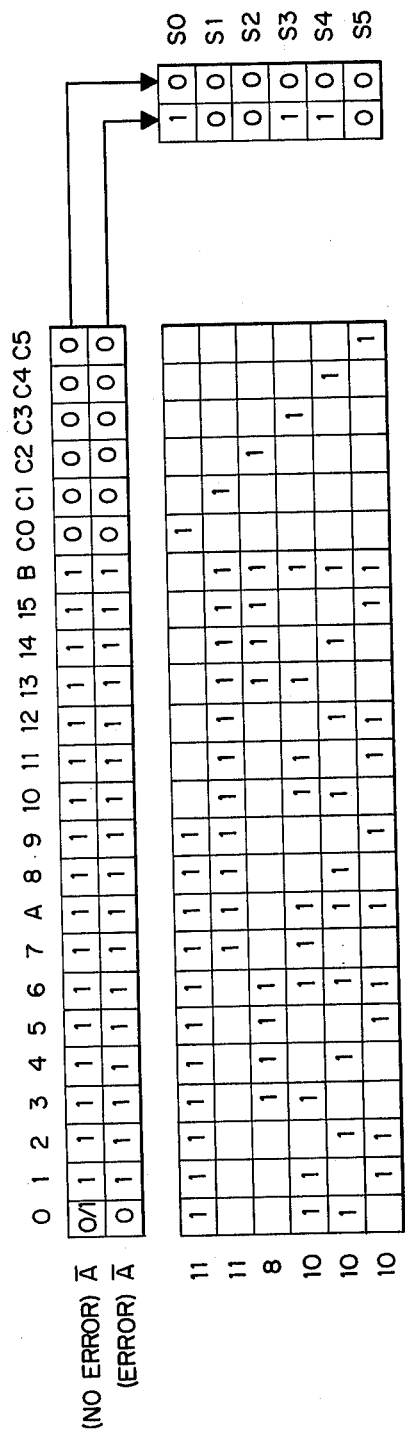
FIG. 4 is a matrix diagram used in explaining the operation of the present invention.

It will be appreciated that where there is a single bit error condition, this causes one of the columns of syndrome bits in FIG. 4 to contain an odd number of binary ONES. For example, it is assumed that when word A is read out from memory subsystem 10-1, it contains an error in bit 0. The bit values appear complemented when read out and hence these values are designated by $\overline{A}$ in FIG. 4.

The decoder circuit 10-50 forces syndrome bits S0, S3 and S4 to binary ONES when bit 0 is a binary ZERO. Syndrome bits S1, S2 and S5 remain binary ZEROS. As seen from FIG. 4, word A without errors causes all of the syndrome bits to be binary ZEROS.

More specifically, with reference to FIG. 2a, signal S0E is forced to a binary ONE and signals S30 and S40 are forced to binary ONES. signal S10 remains a binary ONE while signals S20 and S50 remain binary ZEROS. This results in a code of 001 being applied to the enable input terminals of each decoder circuit and a code of 011 being applied to the select input terminals of each decoder circuit. This enables the decoder circuit 10-620 and causes it to force signal ED0 to a binary ZERO. This in turn causes the exclusive OR circuit 10-640 to force signal CRD0 to a binary ZERO. The odd number of binary ONES causes the circuit 10-684 to force signal YELL to a binary ONE indicating the occurrence of a corrected single error condition.

It will be appreciated that the decoder circuits 10-620 and 10-626 apply signals EC0, EC1, ED7, EDA, ED8 and ED9 to parity circuit 10-66. Since there are no errors associated with any of these bits, both AND gates 10-668 and 10-669 force their outputs to binary ONES. The pairs of signals RC0, RDX and RC1, RDW cause exclusive OR circuits 10-660 and 10-662 to force their outputs to binary ZEROS. The result is that circuits 10-664 and 10-666 force signals CBP0 and CBP1 respectively to binary ONES.

Where there is a single bit error associated with any one of the signals RC0, RDX, RC1 or RDW, this causes corresponding ones of the decoder circuits 10-620 through 10-626 to force an appropriate one of signals EC0, ED8, ED9, EC1, ED7 or EDA to a binary ZERO. As mentioned above, in signal RBP0 assumes the state of signal RC0 when signal RDX is a binary ZERO. When RDX is a binary ONE, signal RBP0 is the complement of signal RC0. When there is a correction, signals EBP0 and EP1 are forced to binary ZEROS. Signals CBP0 and CBP1 assume the states of signals RBP0 and RBP1 respectively.

By having the data error locator circuits 10-62 provide signals from which the correct parity bits can be produced, reduces substantially the amount of circuits normally required for generating parity signals.

It will be noted that the error locator circuits in response to multiple error conditions produced by double data bit error, a bus parity error or byte write error are not enabled by the syndrome bits S0 through S5. That is, the syndrome bits S0 through S5 in such instances contain an even number of binary ONES in those column(s) of the matrix associated with the error condition(s). The combinations of syndrome signals applied to the decoder circuits 10-620 through 10-628 produce signals only at the unused output terminals of these circuits. Hence, no correction takes place.

From the foregoing, it is seen how the error locator circuits constructed in accordance with the principles of the present invention reduce significantly the number of circuits normally required for locating single, double and parity bit errors and for providing parity signals without any reduction in the speed of operation. This results in increased reliability.

It will also be appreciated that the arrangement of the present invention reduces the number of inputs required for generating the desired correction signals. Thus, the arrangement facilitates construction of the memory subsystem with integrated circuits (i.e., easier to etch interconnections, reduces number of interconnections, etc.).

It will be appreciated by those skilled in the art that many changes may be made to the preferred embodiment of the present invention. For example, this could include changes in the number of bits included in a word and the like.

While in accordance with the provisions and statutes there has been illustrated and described the best forms of the invention known, certain changes may be made to the system described without departing from the spirit of the invention as set forth in the appended claims and, in some cases, certain features of the invention may be used to advantage without a corresponding use of other features.

What is claimed is:

1. In a data processing system including a memory subsystem having a memory for storing groups of data signals, each group including a number of data bits and error detection and correction (EDAC) means including an encoder for generating a group of check code bit signals for each of said groups of data signals for storage in said memory together with the group of data signals associated therewith and a syndrome decoder for generating a group of syndrome bit signals in response to each group of data signals and group of check code bits read out from said memory, said group of syndrome signals for detecting correctable and uncorrectable error conditions within said group of data and check code bits signals, said EDAC means further including EDAC correction circuits comprising:
  a plurality of decoder circuit means, each having a number of input terminals and a number of output terminals including first and second groups, said number of input terminals of each decoder circuit means being connected to receive a different combination of said group of syndrome signals from said syndrome decoder;
  a plurality of data bit correction circuit means connected to receive each said group of data signals read out from said memory, said plurality corresponding to said number of data bits, each of said data bit correction circuit means being connected to a different one of said first group of output terminals of one of said plurality of decoder circuit means and being connected to receive a different one of said number of data bits; and,
  said plurality of decoder circuit means being conditioned by said group of syndrome signals to force a predetermined one of said first group of output terminals of one of said plurality of decoder circuit means to a predetermined state for enabling correction of a data bit signal by one of said pluarlity of said correction circuit means when said group of syndrome signals designate the presence of a correctable error condition and said plurality of decoder circuit means being conditioned by said group of syndrome signals to force one of said second group of output terminals of one of said plurality of decoder circuit means to said predetermined state for inhibiting correction of any of said data bit signals by said plurality of correction circuit means when said group of syndrome signals designate the presence of an uncorrectable error condition.

2. The system of claim 1 wherein said group of syndrome signals includes first and second groups of binary signals, said first group of binary signals being coded to designate which one of said plurality of decoder circuit means is to be enabled for operation and said second group of binary signals being coded to designate which one of said number of output terminals is to be forced to said predetermined state, and
  said number of input terminals of said plurality of decoder circuit means includes first and second groups of input terminals said first group of each decoder circuit means being connected to receive said first group of binary signals and said second group of each decoder circuit means being connected to receive said second group of binary signals.

3. The system of claim 2 wherein said first group of input terminals are enable inputs and said second group of input terminals are select inputs, said first group of input terminals of each decoder circuit means being connected to receive a different combination of said first group of syndrome signals and said second group of input terminals of said plurality of decoder circuit means being connected to receive the same combination of said second group of syndrome signals.

4. The system of claim 3 wherein said first group of said output terminals includes no greater than one-half the total number of said output terminals.

5. The system of claim 4 wherein said first group and second group of input terminals correspond to one-half the total number of said input terminals.

6. The system of claim 1 wherein said predetermined state is a binary ZERO state and wherein each of said data bit correction circuit means includes an exclusive OR circuit, said exclusive OR circuit being conditioned by said predetermined state from one of said second group of output terminals to complement the state of said data bit signal to correct the correctable error condition.

7. The system of claim 6 wherein said correctable error condition corresponds to a single bit error and said uncorrectable error condition includes double bit and check code bit error conditions.

8. The system of claim 1 wherein each group of data signals further includes a parity bit and said encoder is connected to receive at least one parity bit coded for indicating the validity of a group of data signals associated therewith, said encoder generating said group of check code bits from said group of data signals and said one parity bit to include at least one check bit signal for deriving the state of said one parity bit and wherein one of said plurality of decoder circuit means forces a predetermined one of said second group of output terminals to said predetermined state for indicating that said derived state of said one parity bit is in error, said EDAC correction circuits further including logic circuit means connected to said predetermined one of said second group of output terminals and said one check bit signal for producing a signal corresponding to the correct state of said one parity bit derived from said one check bit signal in parallel with any correction of said data bit signals.

9. The system of claim 8 wherein said logic circuit means includes:
  first logic gating means connected to receive said one check code bit signal and predetermined ones of said data bit signals required for deriving the state of said one parity bit signal;
  second logic gating means connected to predetermined ones of said first group of output terminals which indicate the correctness of said one check code bit signal and predetermined ones of said data bit signals; and
  output logic gating means connected to said first and second logic gating means, said output logic gating means being conditioned by said first and second logic gating means to generate said signal corresponding to the correct state of said one parity bit.

10. The system of claim 9 wherein said first logic gating means and output logic gating means each include an exclusive OR circuit.

11. A data processing system including a memory subsystem comprising a memory for storing data signals received from a plurality of devices, said data signals including a number of groups of data bits and a corresponding number of parity bits for indicating the validity of said groups of data bits, an encoder for generating a group of check code bits derived from said data signals for writing into said memory together with said number of data bits and a decoder for generating a plurality of syndrome signals from said number of data bits and check bit signals accessed from said memory for locating errors in said data signals, said memory subsystem further comprising:
  error location circuit means connected to said decoder for generating signals designating locations of single bit and double bit errors, said circuit means including a plurality of decoder circuits, each decoder circuit having a number of input terminals for receiving said syndrome signals and a number of output terminals for generating said signals indicating said locations of said single bit and double bit errors;

a plurality of data bit correction circuits, each being connected to receive a different one of said number of data bits; and, conductor means for connecting each of said plurality of data bit correction circuits to a different one of said output terminals of one of said decoder circuits which designates the presence of single bit error in said different one of said number of data bits, said plurality of decoder circuits in response to said syndrome signals designating single and double bit errors being operative to produce a predetermined signal at a connected one of said output terminals to enable said plurality of correction circuits for correction of only single bit errors in said data bits.

12. The system of claim 11 wherein a number of said check code subsystem bits generated by said encoder designate the states of said number of said parity bits, and wherein said subsystem further includes logic circuit means connected to receive said number of said check code bits and connected to a number of connected and unconnected output terminals of said plurality of decoder circuits, said logic circuit means being operative to produce a number of signals corresponding to the correct states of said number of parity bits in parallel with any required correction of said data bits.

13. The system of claim 12 wherein said number of parity bits and check code bits is one and wherein said logic circuit means includes:

first logic gating means connected to receive said check code bit and predetermined ones of said data bits required for deriving the state of said parity bit;

second logic gating means connected to a predetermined one of an unconnected output terminal which indicates the correctness of said check code bit and to predetermined ones of said connected output terminals which indicate the correctness of said predetermined ones of said data bits; and, output logic gating means connected to said first and second gating means, said output logic gating means being conditioned by said first and second logic gating means to generate said correct state of said parity bit.

14. The system of claim 9 wherein said first logic gating means and output logic gating means, each include exclusive OR circuits.

15. The system of claim 11 wherein said group of syndrome signals includes first and second groups of binary signals, said first group of binary signals being coded to designate which one of said plurality of decoder circuits is to be enabled for operation and said second group of binary signals being coded to designate which one of said number of output terminals is to produce said predetermined signal.

16. The system of claim 15 wherein said number of input terminals of each decoder circuit includes a group of enable inputs and a group of select inputs, said enable inputs of each decoder circuit being connected to receive said first group of binary signals and said select inputs of each decoder circuit being connected to receive said second group of binary signals.

17. A data processing system including a memory subsystem having a memory for storing groups of data signals, each group including a number of data bits and at least one parity bit for indicating the validity of said data bits and error detection and correction (EDAC) means including a encoder for generating a group of check code bits from said number of data bits and said parity bit of each group for storage with said number of data bits of said each group and a decoder for generating pairs of complementary syndrome signals in reponse to said data bits and said group of check code bits, said pairs of complementary syndrome signals for detecting double bit errors and single bit errors in said number of data bits, said group of check code bits and said parity bit, said memory system further comprising:

error locator circuit means connected to said decoder for receiving predetermined ones of said pairs of said complementary syndrome signals, said error locator circuit means including a number of decoder circuits, each decoder circuit having a number of input terminals connected for receiving a different combination of said predetermined ones of said pairs of complementary syndrome signals and a number of output terminals for generating predetermined output signals indicating the location of single bit errors in said data bits and check code bits and double bit errors;

a plurality of data bit correction circuits, each being connected to receive a different one of said number of data bits and being connected to a predetermined one of said output terminals of one of said decoder circuits which designates the presence of a single bit error in said different one of said number of data bits; and, logic circuit means for generating said parity bit, said circuit means being connected to receive at least one of said check code bits and predetermined ones of said data bits and said circuit means being connected to a number of said output terminals of predetermined ones of said decoder circuits which generate signals indicate the location of single bit errors in said one of said check code bits and said predetermined ones of said data bits, said plurality of decoder circuits in response to said predetermined ones of said pairs of complementary syndrome signals being operative to force different ones of said output terminals to a predetermined state for conditioning said plurality of data bit correction circuits and said logic circuit means for correction of only single bit errors enabling the correction of said number of data bits and the generation of said parity bit to proceed concurrently.

18. The system of claim 17 wherein said logic circuit means includes:

first logic gating means connected to receive said one check code bit and said predetermined ones of said data bits;

second logic gating means connected to said predetermined ones of said output terminals which indicates the correctness of said one check code bit and said predetermined ones of said data bits; and, output logic gating means connected to said first and second logic gating means, said output logic gating means being conditioned by said first and second logic gating means to generate said one parity bit.

19. The system of claim 18 wherein said first logic gating means and said output gating means each include exclusive OR circuits.

20. The system of claim 19 wherein said predetermined ones of said pairs of complementary syndrome signals first and second groups of binary coded signals, said first group of binary coded signals designating which one of said number of decoder circuits is to be enabled and said second group of binary coded signals designating which one of said number of output terminals of said designated decoder circuit is to produce one of said predetermined output signals.

21. The system of claim 20 wherein said number of said decoder circuits is equal to more than one-half said number of check code bits and less than said number of said check code bits.

* * * * *